US010831249B2

(12) United States Patent
Jiang et al.

(10) Patent No.: US 10,831,249 B2
(45) Date of Patent: Nov. 10, 2020

(54) HEAT CONDUCTION COMPONENT AND MOBILE TERMINAL (71) Applicant: Huawei Technologies Co., Ltd., Shenzhen (CN)

(72) Inventors: Huawen Jiang, Shenzhen (CN); Linfang Jin, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/490,822

(22) PCT Filed: Jul. 31, 2017

(86) PCT No.: PCT/CN2017/095153
§ 371 (c)(1),
(2) Date: Sep. 3, 2019

(87) PCT Pub. No.: WO2018/157545
PCT Pub. Date: Sep. 7, 2018

(65) Prior Publication Data
US 2019/0391623 A1 Dec. 26, 2019

(30) Foreign Application Priority Data
Mar. 2, 2017 (CN) .......................... 2017 1 0121682

(51) Int. Cl.
*H05K 7/20* (2006.01)
*G06F 1/20* (2006.01)
(52) U.S. Cl.
CPC .............. *G06F 1/203* (2013.01); *H05K 7/20* (2013.01)
(58) Field of Classification Search
CPC .................................... H05K 7/20; G06F 1/203
(Continued)

(56) References Cited
U.S. PATENT DOCUMENTS 5,472,043 A * 12/1995 Larson ................ F28D 15/0233
165/104.21
5,485,671 A * 1/1996 Larson ................ F28D 15/0241
165/104.19
(Continued)

FOREIGN PATENT DOCUMENTS

CN  2494036 Y  5/2002
CN  2681341 Y  2/2005
(Continued)

OTHER PUBLICATIONS

Machine Translation and Abstract of Chinese Publication No. CN2681341, Feb. 23, 2005, 8 pages.
(Continued)

*Primary Examiner* — Anatoly Vortman
(74) *Attorney, Agent, or Firm* — Conley Rose, P.C.

(57) ABSTRACT

A heat conduction component and a mobile terminal are disclosed. The heat conduction component is applied to a mobile terminal. The heat conduction component includes a support part and a heat dissipation part. A cavity is disposed inside the support part. The heat dissipation part is disposed in the cavity, and the heat dissipation part has mesh capillary holes. The heat source component is located at one end of the heat dissipation part, a low temperature area is located at the other end of the heat dissipation part, and a temperature of the low temperature area is lower than a temperature of an area in which the heat source component is located. A heat conduction medium is disposed in the mesh capillary hole of the heat dissipation part.

20 Claims, 8 Drawing Sheets

(58) Field of Classification Search
USPC .................................................. 361/679.52
See application file for complete search history.

(56) References Cited

U.S. PATENT DOCUMENTS

| | | | | |
|---|---|---|---|---|
| 6,069,791 | A * | 5/2000 | Goto | G06F 1/203 |
| | | | | 165/104.33 |
| 6,082,443 | A * | 7/2000 | Yamamoto | F28D 15/0233 |
| | | | | 165/104.21 |
| 6,178,088 | B1 * | 1/2001 | Gates | H01L 23/427 |
| | | | | 361/699 |
| 6,410,982 | B1 * | 6/2002 | Brownell | F28D 15/0266 |
| | | | | 257/713 |
| 6,418,017 | B1 * | 7/2002 | Patel | G06F 1/203 |
| | | | | 165/104.33 |
| 6,508,302 | B2 * | 1/2003 | Ishida | B21C 37/151 |
| | | | | 165/104.21 |
| 6,639,799 | B2 * | 10/2003 | Prasher | H01L 23/427 |
| | | | | 165/80.4 |
| 6,745,825 | B1 * | 6/2004 | Nakamura | F28D 15/0233 |
| | | | | 165/104.26 |
| 6,785,135 | B2 * | 8/2004 | Ohmi | H05K 7/20336 |
| | | | | 361/700 |
| 6,880,626 | B2 * | 4/2005 | Lindemuth | B22F 7/004 |
| | | | | 165/104.26 |
| 7,007,741 | B2 * | 3/2006 | Sen | H01L 23/433 |
| | | | | 165/185 |
| 7,652,885 | B2 * | 1/2010 | Tomioka | F28D 15/0266 |
| | | | | 165/104.26 |
| 7,738,248 | B2 * | 6/2010 | Tomioka | G06F 1/203 |
| | | | | 165/104.21 |
| 8,737,071 | B2 * | 5/2014 | Hao | H01L 23/427 |
| | | | | 165/104.21 |
| 8,792,240 | B2 * | 7/2014 | Feng | H05K 7/20336 |
| | | | | 361/700 |
| 9,101,979 | B2 | 8/2015 | Hofmann et al. | |
| 9,568,255 | B2 * | 2/2017 | Tan | F28D 15/0275 |
| 10,103,087 | B2 * | 10/2018 | Jin | H01L 23/427 |
| 10,437,299 | B2 * | 10/2019 | Wang | G06F 1/203 |
| 2007/0187072 | A1 * | 8/2007 | Chin | F28D 15/043 |
| | | | | 165/104.26 |
| 2008/0068802 | A1 * | 3/2008 | Chen | H01L 23/427 |
| | | | | 361/703 |
| 2008/0115913 | A1 | 5/2008 | Henderson et al. | |
| 2008/0283223 | A1 * | 11/2008 | Chang | F28D 15/043 |
| | | | | 165/104.26 |
| 2016/0007504 | A1 * | 1/2016 | Wu | H05K 1/0203 |
| | | | | 361/700 |
| 2016/0088769 | A1 * | 3/2016 | Hsiao | G06F 1/20 |
| | | | | 361/700 |
| 2017/0055372 | A1 | 2/2017 | Ahamed et al. | |
| 2017/0074596 | A1 * | 3/2017 | Wang | F28D 15/0266 |
| 2017/0139452 | A1 * | 5/2017 | Yang | H05K 7/2039 |
| 2020/0116437 | A1 * | 4/2020 | Zhang | F28D 15/04 |

FOREIGN PATENT DOCUMENTS

| | | |
|---|---|---|
| CN | 101472450 A | 7/2009 |
| CN | 103249276 A | 8/2013 |
| CN | 104902727 A | 9/2015 |
| CN | 204669802 U | 9/2015 |
| CN | 105658032 A | 6/2016 |
| CN | 106052444 A | 10/2016 |
| GB | 2532704 A | 6/2016 |
| WO | 2016171715 A1 | 10/2016 |

OTHER PUBLICATIONS

Machine Translation and Abstract of Chinese Publication No. CN101472450, Jul. 1, 2009, 13 pages.
Machine Translation and Abstract of Chinese Publication No. CN103249276, Aug. 14, 2013, 11 pages.
Machine Translation and Abstract of Chinese Publication No. CN104902727, Sep. 9, 2015, 13 pages.
Machine Translation and Abstract of Chinese Publication No. CN105658032, Jun. 8, 2016, 15 pages.
Machine Translation and Abstract of Chinese Publication No. CN204669802, Sep. 23, 2015, 13 pages.
Foreign Communication From a Counterpart Application, PCT Application No. PCT/CN2017/095153, English Translation of International Search Report dated Dec. 1, 2017, 2 pages.
Foreign Communication From a Counterpart Application, PCT Application No. PCT/CN2017/095153, English Translation of Written Opinon dated Dec. 1, 2017, 4 pages.
Foreign Communication From a Counterpart Application, European Application No. 17898733.5, Extended European Search Report dated Jan. 3, 2020, 9 pages.

* cited by examiner

HEAT CONDUCTION COMPONENT AND MOBILE TERMINAL

CROSS-REFERENCE TO RELATED APPLICATIONS

This application is a national stage of International Application No. PCT/CN2017/095153, filed on Jul. 31, 2017, which claims priority to Chinese Patent Application No. 201710121682.5, filed on Mar. 2, 2017. Both of the aforementioned applications are hereby incorporated by reference in their entireties.

This application claims priority to Chinese Patent Application No, 201710121682.5, filed with the Chinese Patent Office on Mar. 2, 2017 and entitled "HEAT CONDUCTION MATERIAL APPLIED TO MOBILE TERMINAL", which is incorporated herein by reference in its entirety.

TECHNICAL FIELD

This application relates to electronic technologies, and in particular, to a heat conduction component and a mobile terminal.

BACKGROUND

With development of wireless communications technologies, a mobile terminal such as a mobile phone or a tablet computer is widely applied. The mobile terminal usually includes a front housing, a metal middle plate, a rear housing, and various electronic components. The electronic component may be disposed on a printed circuit board (Printed Circuit Board, PCB), and the PCB may be disposed on the metal middle plate by using a screw. The PCB is separated by a battery compartment area into two parts, namely, a PCB primary board in an upper half part and a PCB secondary board in a lower half part. Usually, a primary heating component such as a system on chip (System on Chip, SoC) is disposed on the PCB primary board, and a low power component is disposed on the PCB secondary board.

Figure 1:
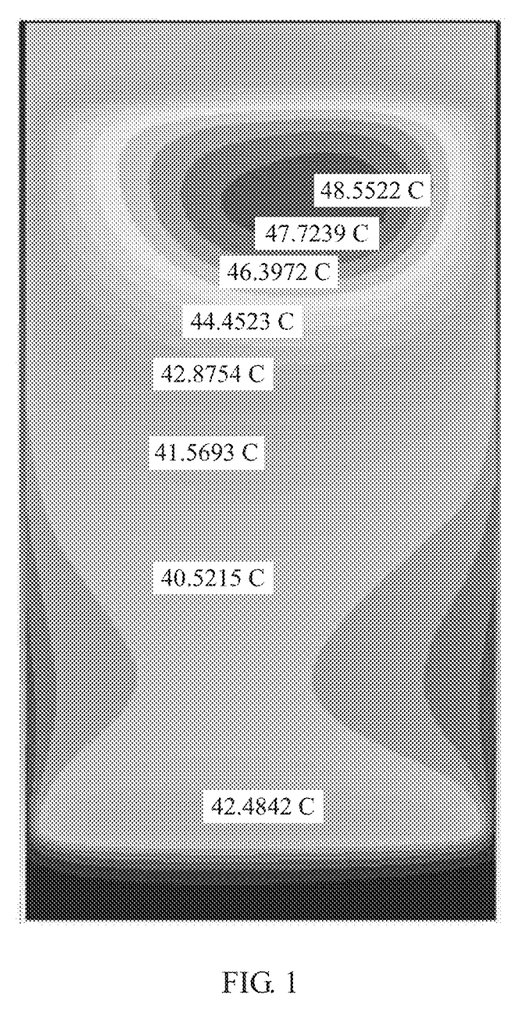
FIG. 1 is a schematic diagram of temperature distribution on a front facet of a mobile terminal.

FIG. 1 is a schematic diagram of a temperature distribution on a front facet of a mobile terminal. As shown in FIG. 1, a temperature of an upper half part is relatively high, and a temperature of a lower half part is relatively low. A specific reason is that an SoC is disposed on a PCB primary board, and power consumption is mainly from the SoC. Therefore, as shown in FIG. 1, a temperature of an area, corresponding to the PCB primary board, on the front facet of the mobile terminal is relatively high, but temperatures of areas, corresponding to a PCB secondary board and a battery compartment area, on the front facet of the mobile terminal are relatively low. Consequently, the temperature distribution on the front facet of the mobile terminal is severely uneven.

To resolve the foregoing problem of uneven temperature distribution, and meet a requirement of designing a light and thin mobile terminal with integrated functions, a metal middle plate made of a metal material such as stainless steel, an aluminum alloy, or a copper alloy is disposed on the mobile terminal, to implement heat conduction and heat equalization for the mobile terminal based on heat conductivity of the metal material of the metal middle plate, and provide structural support for the mobile terminal based on metal strength of the metal material of the middle metal plate. Further, to improve a heat conduction property of the metal middle plate, a graphite film may be further covered on the metal middle plate.

However, in the foregoing manner of implementing heat conduction and heat equalization for the mobile terminal by using the metal material and the graphite film, the heat conduction property of the mobile terminal cannot meet a heat dissipation requirement with higher user satisfaction in the future.

SUMMARY

Embodiments of this application provide a heat conduction component and a mobile terminal, so as to meet a heat dissipation requirement of the mobile terminal.

According to a first aspect, an embodiment of this application provides a heat conduction component. The heat conduction component is applied to a mobile terminal and is configured to conduct heat for a heat source component of the mobile terminal. The heat conduction component includes a support part and a heat dissipation part. A cavity is disposed inside the support part. The heat dissipation part is disposed in the cavity, and the heat dissipation part has mesh capillary holes. The heat source component is located at one end of the heat dissipation part, a low temperature area is located at the other end of the heat dissipation part, and a temperature of the low temperature area is lower than a temperature of an area in which the heat source component is located. A heat conduction medium is disposed in the mesh capillary hole of the heat dissipation part, and the heat conduction medium is configured to: when the heat source component operates, conduct heat generated by the heat source component from the one end to the other end of the heat dissipation part. The support part and the heat dissipation part are of an integrated metal structure.

In this implementation, the heat dissipation part having the mesh capillary holes is disposed, and the heat conduction medium is disposed in the heat dissipation part, so as to conduct heat for the heat source component of the mobile terminal. The one end of the heat dissipation part fits the heat source component, and the other end fits the low temperature area, so that the heat generated by the heat source component can be conducted to the low temperature area, thereby implementing even temperature distribution of the mobile terminal. In this way, a temperature of the heat source component is reduced, so that even temperature distribution of the mobile terminal is implemented, thereby meeting a heat dissipation requirement of the mobile terminal. In addition, because the support part and the heat dissipation part of the heat conduction component are of an integrated structure, the heat conduction component may further provide mechanical support for the mobile terminal, so that a mechanical support requirement of the mobile terminal is met while a heat dissipation requirement of the heat source component is met, thereby implementing integration of a heat conduction and heat equalization function and a mechanical support function.

With reference to the first aspect, in a possible implementation of the first aspect, a heat dissipation channel is further disposed in the heat dissipation part, the heat dissipation channel is a cylindrical through hole, and the heat dissipation channel extends through two ends of the heat dissipation part. The heat dissipation channel is configured to provide a channel for a gaseous heat conduction medium. The mesh capillary hole is configured to provide a channel for a liquid heat conduction medium. A function of the heat dissipation part is as follows: when the heat source component operates, the liquid heat conduction medium in the mesh capillary hole is changed from a liquid state to a gaseous state at the one end of the heat dissipation part under the action of the heat generated by the heat source component, the gaseous heat conduction medium flows to the other end of the heat dissipation part through the heat dissipation channel and is changed from a gaseous state to a liquid state at the other end of the heat dissipation part under the action of a low temperature of the low temperature area, and the liquid heat conduction medium is returned, through the mesh capillary hole, to the one end at which the heat source component is located.

In this implementation, the heat dissipation channel is disposed in the heat dissipation part, so that the heat of the heat source component is more easily conducted, thereby improving heat dissipation efficiency.

With reference to the first aspect or any possible implementation of the first aspect, in another possible implementation of the first aspect, there is at least one heat dissipation channel.

In this implementation, one or more heat dissipation channels are disposed in the heat dissipation part, so as to further improve heat dissipation efficiency.

With reference to the first aspect or any possible implementation of the first aspect, in another possible implementation of the first aspect, a plurality of heat dissipation channels are mutually disposed in parallel.

In this implementation, the plurality of heat dissipation channels that are mutually parallel are disposed in the heat dissipation part, so that the heat of the heat source component is conducted through the plurality of heat dissipation channels, thereby improving heat dissipation efficiency.

With reference to the first aspect or any possible implementation of the first aspect, in another possible implementation of the first aspect, at least one of a shape and a size of the cavity in which the heat dissipation part is disposed is determined with reference to positions of the heat source component and the low temperature area.

With reference to the first aspect or any possible implementation of the first aspect, in another possible implementation of the first aspect, the heat conduction component further includes a rib, and the rib is disposed in the heat dissipation part and is connected to the support part.

In this implementation, the rib is disposed in the heat dissipation part, so that structural strength of the heat conduction component can be effectively increased.

With reference to the first aspect or any possible implementation of the first aspect, in another possible implementation of the first aspect, there is at least one rib, and a length direction of each rib is perpendicular to a length direction of the support part.

With reference to the first aspect or any possible implementation of the first aspect, in another possible implementation of the first aspect, the rib and the support part have a same 3D sintering process parameter.

In this implementation, integration of the support part in the heat conduction component and the rib in the heat dissipation part is implemented by using a 3D sintering process, so that structural strength of the heat conduction component can be increased.

With reference to the first aspect or any possible implementation of the first aspect, in another possible implementation of the first aspect, the support part and the heat dissipation part have different 3D sintering process parameters.

In this implementation, composite sinter molding of the support part and the heat dissipation part can be conveniently implemented.

According to a second aspect, an embodiment of this application provides a mobile terminal. The mobile terminal includes the heat conduction component in any one of the possible implementations of the first aspect. The heat conduction component is used as a middle plate of the mobile terminal, and is configured to conduct heat for a heat source component of the mobile terminal.

According to the heat conduction component and the mobile terminal in the embodiments of this application, the heat dissipation part having the mesh capillary holes is disposed, and the heat conduction medium is disposed in the heat dissipation part, so as to conduct heat for the heat source component of the mobile terminal. The one end of the heat dissipation part fits the heat source component, and the other end fits the low temperature area, so that the heat generated by the heat source component can be conducted to the low temperature area, thereby implementing even temperature distribution of the mobile terminal. In this way, a temperature of the heat source component is reduced, so that even temperature distribution of the mobile terminal is implemented, thereby meeting a heat dissipation requirement of the mobile terminal. In addition, because the support part and the heat dissipation part of the heat conduction component are of an integrated stricture, the heat conduction component may further provide mechanical support for the mobile terminal, so that a mechanical support requirement of the mobile terminal is met while a heat dissipation requirement of the heat source component is met, thereby implementing integration of a heat conduction and heat equalization function and a mechanical support function.

BRIEF DESCRIPTION OF DRAWINGS

To describe the technical solutions in the embodiments of this application or in the prior art more clearly, the following briefly describes the accompanying drawings required for describing the embodiments or the prior art.

DESCRIPTION OF EMBODIMENTS

To make the purpose, technical solutions, and advantages of the embodiments of this application clearer, the following clearly and completely describes the technical solutions of the embodiments of this application with reference to the accompanying drawings in the embodiments of this application.

Figure 2:
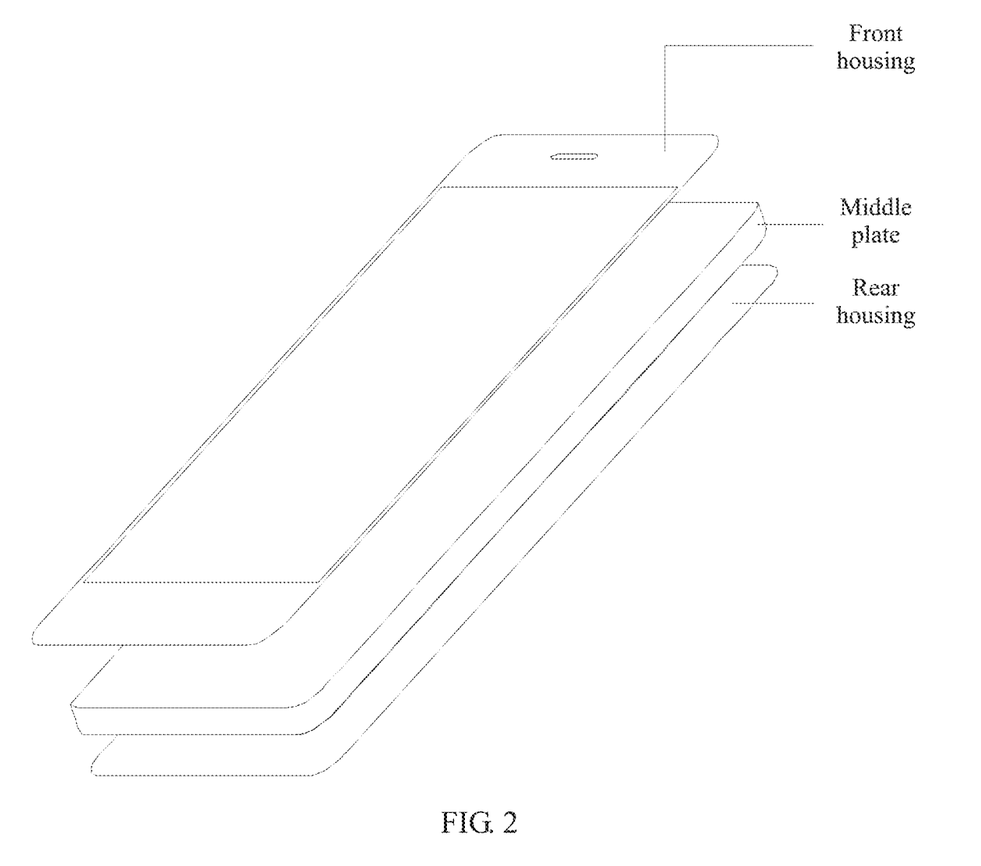
FIG. 2 is a schematic diagram of an application scenario of a heat conduction component according to an embodiment of this application.

FIG. 2 is a schematic diagram of an application scenario of a heat conduction component according to an embodiment of this application. FIG. 2 may also be referred to as an exploded diagram of assembly of a mobile terminal. As shown in FIG. 2, the mobile terminal includes a front housing, a middle plate, and a rear housing. The middle plate may provide structural support, heat conduction, and heat equalization functions for the mobile terminal. Certainly, it may be understood that a display panel, a touch panel, a PCB board that supports electronic parts and components, and the like may be further disposed on the mobile terminal, and are not described herein one by one. The middle plate fits the PCB that supports electronic parts and components, and a heat source component such as an SoC is disposed on the PCB. The heat conduction component provided in this embodiment of this application may be specifically applied to the mobile terminal shown in FIG. 2, and is configured to conduct heat for the heat source component of the mobile terminal. In a feasible implementation, the heat conduction component in this embodiment of this application may be used as the middle plate shown in FIG. 2. Certainly, it may be understood that the heat conduction component in this embodiment of this application may alternatively be an independent component different from the components shown in FIG. 2, and fits the PCB shown in FIG. 2. A specific implementation of the heat conduction component may be flexibly set as needed. In this embodiment of this application, the heat conduction component is disposed on the mobile terminal to conduct heat for the heat source component of the mobile terminal, so as to reduce a temperature of the heat source component, and implement even temperature distribution of the mobile terminal, thereby meeting a heat dissipation requirement of the mobile terminal.

For a specific structure of the heat conduction component in this embodiment of this application, refer to specific explanations and descriptions in the following embodiments.

Figure 3A:
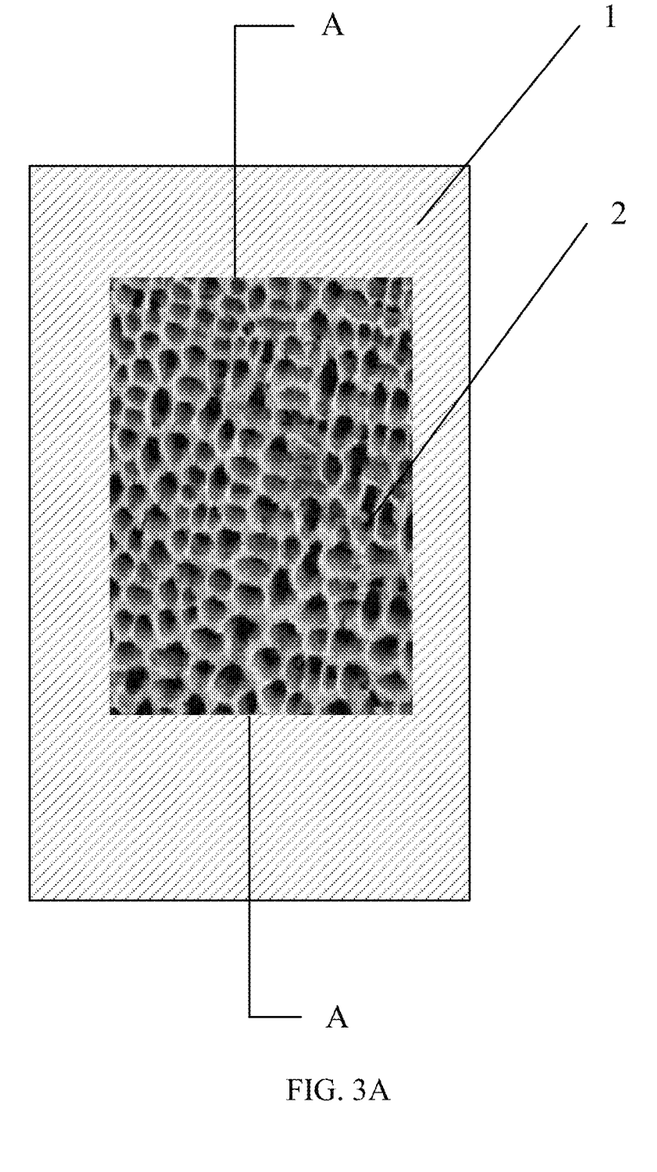
FIG. 3A is a main view of a heat conduction component according to an embodiment of this application.
Figure 3B:
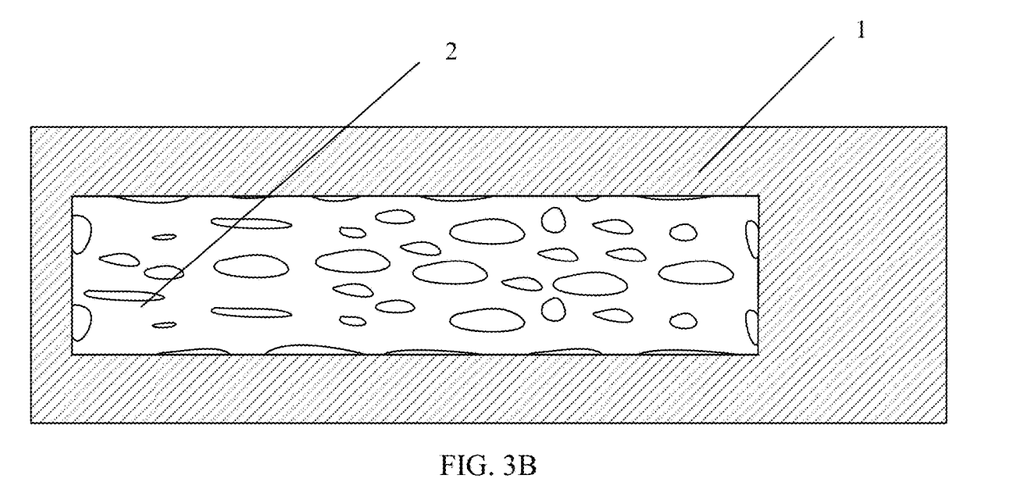
FIG. 3B is a sectional view along a direction A-A shown in FIG. 3A according to an embodiment of this application.

FIG. 3A is a main view of a heat conduction component according to an embodiment of this application. FIG. 3B is a sectional view along a direction A-A shown in FIG. 3A according to an embodiment of this application. With reference to FIG. 3A and FIG. 3A, the heat conduction component in this embodiment may include a support part 1 and a heat dissipation part 2. A cavity is disposed inside the support part 1. The heat dissipation part 2 is disposed in the cavity, and the heat dissipation part has mesh capillary holes. A heat source component is located at one end of the heat dissipation part 2, a low temperature area is located at the other end of the heat dissipation part 2, and a temperature of the low temperature area is lower than a temperature of an area in which the heat source component is located. A heat conduction medium is disposed in the mesh capillary hole of the heat dissipation part 2, and the heat conduction medium is configured to: when the heat source component operates, conduct heat generated by the heat source component from the one end to the other end of the heat dissipation part 2. The support part 1 and the heat dissipation part 2 are of an integrated metal structure.

The heat source component may be specifically a primary heating component such as a system on chip (System on Chip, SoC) that is disposed on a PCB primary board. Because a PCB fits the heat conduction component in this embodiment of this application, the heat source component fits the heat conduction component in this embodiment of this application, and specifically fits the one end of the heat dissipation part 2. The low temperature area may be specifically areas corresponding to a PCB secondary board and a battery compartment area. A low power component may be disposed within a range of the low temperature area. The low temperature area may specifically fit the other end of the heat dissipation part 2.

The heat conduction medium may be liquid with a low boiling point such as water or alcohol, and may be flexibly set based on a heat dissipation requirement.

Specifically, the heat conduction medium is injected into the heat dissipation part 2, to conduct heat for the heat source component of the mobile terminal. The one end of the heat dissipation part 2 fits the heat source component, and the other end fits the low temperature area, so that the heat generated by the heat source component can be conducted to the low temperature area, thereby implementing even temperature distribution of the mobile terminal. In this way, a temperature of the heart source component is reduced, so that even temperature distribution of the mobile terminal is implemented, thereby meeting a heat dissipation requirement of the mobile terminal. In addition, because the support part 1 and the heat dissipation part 2 of the heat conduction component are of an integrated structure, the heat conduction component may further provide mechanical support for the mobile terminal, so that a mechanical support requirement of the mobile terminal is met while a heat dissipation requirement of the heat source component is met, thereby implementing integration of a heat conduction and heat equalization function and a mechanical support function.

An operating principle of the foregoing technical effect of reducing the temperature of the heat source component by using the heat dissipation part 2 to implement even temperature distribution of the mobile terminal is specifically as follows: At the one end of the heat dissipation part 2, namely, the end at which the heat source component is located, the heat source component generates heat during operating. The heat conduction medium in the heat dissipation part 2 is changed from a liquid state to a gaseous state under the action of the heat. However, at the other end of the heat dissipation part 2, namely, the end at which the low temperature area is located, a physical state of the heat conduction medium does not change, or physical states of only a few heat conduction media change. If atmospheric pressure at the end at which the heat source component is located is greater than atmospheric pressure at the end at which the low temperature area is located, the gaseous heat conduction medium flows to the end at which the low temperature area is located through the mesh capillary hole in the heat dissipation part 2. The gaseous heat conduction medium is changed from a gaseous state to a liquid state under the action of a low temperature of the low temperature area at the end at which the low temperature area is located. The liquid heat conduction medium is returned to the end at which the heat source component is located through capillary attraction of the mesh capillary hole in the heat dissipation part 2, until the heat of the heat source component is conducted to the end at which the low temperature area is located, to implement even temperature distribution of the terminal.

It should be noted that a shape or a size, or a shape and a size of the heat dissipation part 2 in this embodiment of this application may be determined based on positions of the heat source component and the low temperature area. After a position condition in which the heat source component is located at the one end of the heat dissipation part 2 and the low temperature area is located at the other end of the heat dissipation part 2 is met, a specific shape and a specific size of the heat dissipation part 2 may be flexibly set based on a heat conduction requirement. For example, after the foregoing position condition is met, when the heat source component of the mobile terminal generates more heat, the heat dissipation part 2 may be set to a larger size, to facilitate heat conduction. Conversely, when the heat source component of the mobile terminal generates less heat, the heat dissipation part 2 may be set to a smaller size, to improve a mechanical support capacity of the mobile terminal while a heat dissipation requirement is met. The shape may be a rectangle, an L-shape, an irregular shape, or the like. In this embodiment, shapes and sizes of the heat dissipation part 2 shown in FIG. 3A and FIG. 3B are merely examples for description, and this embodiment of this application is not limited thereto.

It should be noted that apertures and density of the mesh capillary holes in the heat dissipation part 2 in this embodiment of this application may also be flexibly set as needed.

Optionally, the heat conduction component in this embodiment of this application may be made of a metal material, and specifically, may be made of a metal material that has relatively good heat conductivity and structural support performance, for example, aluminum, copper, or steel.

Optionally, integration of the support part 1 and the heat dissipation part 2 may be specifically implemented by using a 3D printing technology. The 3D printing technology is spreading metal powder on a metal substrate based on a 3D data model of a product, controlling a laser scanning path by using a computer, and finally molding a required product through layer-by-layer scanning and sintering. The 3D printing technology implements more flexible manufacturing, and may be used to process various products with complex shapes and structures. Specifically, the 3D printing technology may be used to sinter the support part 1, or may be used to form the heat dissipation part 2. A process parameter of the 3D printing technology in a product forming process may be accurately controlled and adjusted, and different process parameters may be controlled in different areas of a same layer of metal powder to complete sintering. Therefore, composite sinter molding of the support part 1 and the heat dissipation part 2 can be conveniently implemented.

In this embodiment, the heat dissipation part 2 having the mesh capillary holes is disposed, and the heat conduction medium is disposed in the heat dissipation part 2, so as to conduct heart for the heat source component of the mobile terminal. The one end of the heat dissipation part 2 fits the heat source component, and the other end fits the low temperature area, so that the heat generated by the heat source component can be conducted to the low temperature area, thereby implementing even temperature distribution of the mobile terminal, in this way, a temperature of the heat source component is reduced, so that even temperature distribution of the mobile terminal is implemented, thereby meeting a heat dissipation requirement of the mobile terminal. In addition, because the support part 1 and the heat dissipation part 2 of the heat conduction component are of an integrated structure, the heat conduction component may further provide mechanical support for the mobile terminal, so that a mechanical support requirement of the mobile terminal is met while a heat dissipation requirement of the heat source component is met, thereby implementing integration of a heat conduction and heat equalization function and a mechanical support function.

The following uses several specific embodiments to specifically explain and describe the heart conduction component in the embodiments shown in FIG. 3A and FIG. 3B.

Figure 4A:
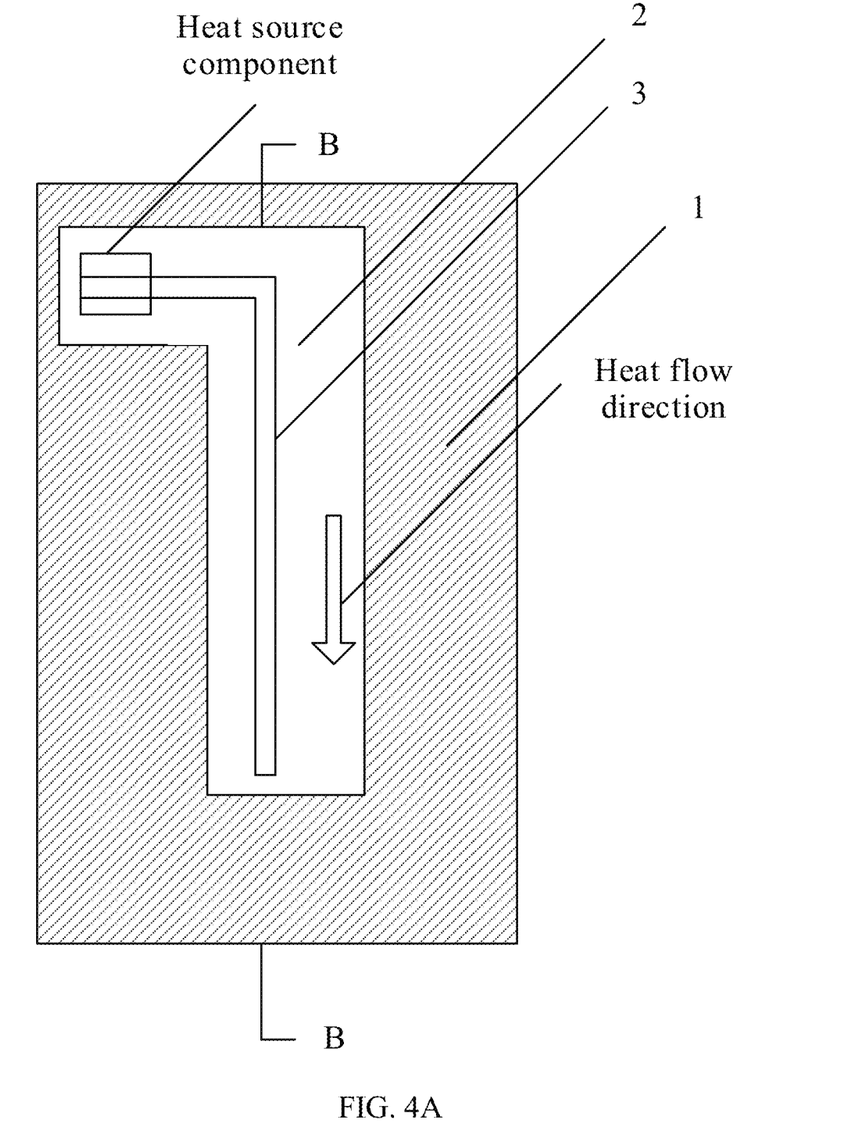
FIG. 4A is a main view of another heat conduction component according to an embodiment of this application.
Figure 4B:
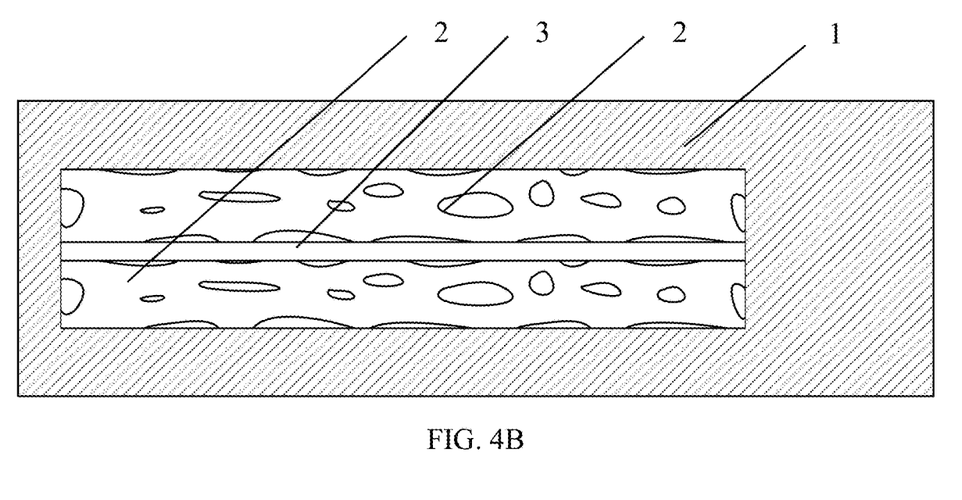
FIG. 4B is a sectional view along a direction B-B shown in FIG. 4A according to an embodiment of this application.

FIG. 4A is a main view of another heat conduction component according to an embodiment of this application. FIG. 4B is a sectional view along a direction B-B shown in FIG. 4A according to an embodiment of this application. As shown in FIG. 4A and FIG. 4B, the heat conduction component is based on the heat conduction component shown in FIG. 3A and FIG. 3B, and a heat dissipation channel 3 is further disposed in the heat dissipation part 2. The heat dissipation channel is a cylindrical through hole, and the heat dissipation channel 3 extends through two ends of the heat dissipation part 2.

The heat dissipation channel 3 is configured to provide a channel for a gaseous heat conduction medium. The mesh capillary hole is configured to provide a channel for a liquid heat conduction medium. A function of the heat dissipation part is as follows: when the heat source component operates, the liquid heat conduction medium in the mesh capillary hole is changed from a liquid state to a gaseous state at the one end of the heat dissipation part 2 under the action of the heat generated by the heat source component, the gaseous heat conduction medium flows to the other end of the heat dissipation part 2 through the heat dissipation channel 3 and is changed from a gaseous state to a liquid state at the other end of the heat dissipation part 2 under the action of a low temperature of the low temperature area, and the liquid heat conduction medium is returned, through the mesh capillary hole, to the one end at which the heat source component is located.

Specifically, similar to the operating principle of the heat conduction component shown in FIG. 3A and FIG. 3B, at the one end of the heat dissipation part 2, namely, the end at which the heat source component is located, the heat source component generates heat during operating. The heat conduction medium in the heat dissipation part 2 is changed from a liquid state to a gaseous state under the action of the heat. However, at the other end of the heat dissipation part 2, namely, the end at which the low temperature area is located, a physical state of the heat conduction medium does not change, or physical states of only a few heat conduction media change. If atmospheric pressure at the end at which the heat source component is located is greater than atmospheric pressure at the end at which the low temperature area is located, the gaseous heat conduction medium flows to the end at which the low temperature area is located through the heat dissipation channel 3 in the heat dissipation part 2. The gaseous heat conduction medium is changed from a gaseous state to a liquid state under the action of a low temperature of the low temperature area at the end at which the low temperature area is located. The liquid heat conduction medium is returned to the end at which the heat source component is located through capillary attraction of the mesh capillary hole in the heat dissipation part 2, until the heat of the heat source component is conducted to the end at which the low temperature area is located, to implement even temperature distribution of the terminal.

A reason why the gaseous heat conduction medium flows to the end at which the low temperature area is located through the heat dissipation channel 3 in the heat dissipation part 2 is that the heat dissipation channel 3 is a cylindrical through hole, and resistance of the heat dissipation channel 3 to gas is less than resistance of the mesh capillary hole in the heat dissipation part 2 to gas. Disposing the heat dissipation channel 3 can facilitate diffusion of the gaseous heat conduction medium, so as to improve heat conduction efficiency of the heat conduction component.

It should be noted that a magnitude of a diameter of the heat dissipation channel 3 may also be flexibly set as needed. For example, when the heat source component of the mobile terminal is relatively sensitive to a temperature, and a prolonged high temperature damages the heat source component, the diameter of the heat dissipation channel 2 may be set to a relatively large value, so as to facilitate relatively rapid heat conduction. Certainly, it may be understood that the magnitude of the diameter of the heat dissipation channel 2 may be further comprehensively selected with reference to a size of the heat dissipation part 2 and a size of the support part 1, so as to improve performance of the mobile terminal using the heat conduction component.

Optionally, at least one of a shape and a size of the cavity in which the heat dissipation part 2 is disposed is determined with reference to positions of the heat source component and the low temperature area. In other words, the shape and the size of the cavity in which the heat dissipation part 2 is disposed need to meet the foregoing position condition. After the position condition is met, a specific shape and a specific size of the cavity may be flexibly set based on a heat conduction requirement.

As shown in FIG. 4A, the one end of the heat dissipation part 2 covers the heat source component, and the other end of the heat dissipation part 2 is far from the heat source component, in other words, the other end of the heat dissipation part 2 covers the low temperature area. As shown above, the heat conduction medium of the heat dissipation part 2 may conduct the heat of the heat source component to the low temperature area, so as to reduce a temperature of the heat source component. As shown in FIG. 4A, the heat dissipation part 2 is L-shaped, and this is merely used as an example for description in this embodiment of this application. The heat dissipation part 2 may have another shape, for example, with a 60-degree or 30-degree bending angle, and the heat dissipation part 2 may have another size. The shape and the size of the heat dissipation part 2 may be mainly determined based on a position of the heat source component, a heat dissipation requirement of the heat source component, and the like.

It should be noted that there may be one or more heat source components, and a specific shape and a specific size of the heat dissipation part 2 may be flexibly set based on positions of the one or more heat dissipation components and a position of the low temperature area, which all can meet a heat dissipation requirement of the mobile terminal.

It should be noted that when the heat conduction component shown in FIG. 4A is used as a middle plate of the mobile terminal, to implement fitting between the heat conduction component and another component of the mobile terminal, a recess, a protrusion, a hole, and the like may be provided on a surface of the heat conduction component, and are not shown one by one in FIG. 4A in this embodiment of this application. FIG. 4A is merely an example for illustrative description.

Optionally, there may be one or more heat dissipation channels 3. A specific quantity of heat dissipation channels 3 may be flexibly selected based on a heat dissipation requirement of the heat source component. When there are a plurality of heat dissipation channels 3, the heat dissipation channels are disposed in parallel.

Optionally, the end, of the heat dissipation channel 3, at which the low temperature area is located may be further extended to the support part 1. In other words, the heat dissipation channel 2 is provided with an end face outlet. This disposing manner is used to clear powder in the heat dissipation channel 3, perform negative pressure suction, and fill the heat conduction medium after the heat conduction component in this embodiment of this application is sintered. After the heat conduction medium is filled, the end face outlet of the heat conduction channel 3 is closed by using a process scheme such as welding.

In this embodiment, the heat dissipation part 2 having the mesh capillary holes is disposed, and the heat conduction medium is disposed in the heat dissipation part 2, so as to conduct heat for the heat source component of the mobile terminal. The one end of the heat dissipation part 2 fits the heat source component, and the other end fits the low temperature area, so that the heat generated by the heat source component can be conducted to the low temperature area, thereby implementing even temperature distribution of the mobile terminal. In this way, a temperature of the heat source component is reduced, so that even temperature distribution of the mobile terminal is implemented, thereby meeting a heat dissipation requirement of the mobile terminal. In addition, because the support part 1 and the heat dissipation part 2 of the heat conduction component are of an integrated structure, the heat conduction component may further provide mechanical support for the mobile terminal, so that a mechanical support requirement of the mobile terminal is met while a heat dissipation requirement of the heat source component is met, thereby implementing integration of a heat conduction and heat equalization function and a mechanical support function.

In addition, the heat dissipation channel 3 is disposed in the heat dissipation part 2, so that the heat of the heat source component is more easily conducted, thereby improving heat dissipation efficiency.

Figure 5A:
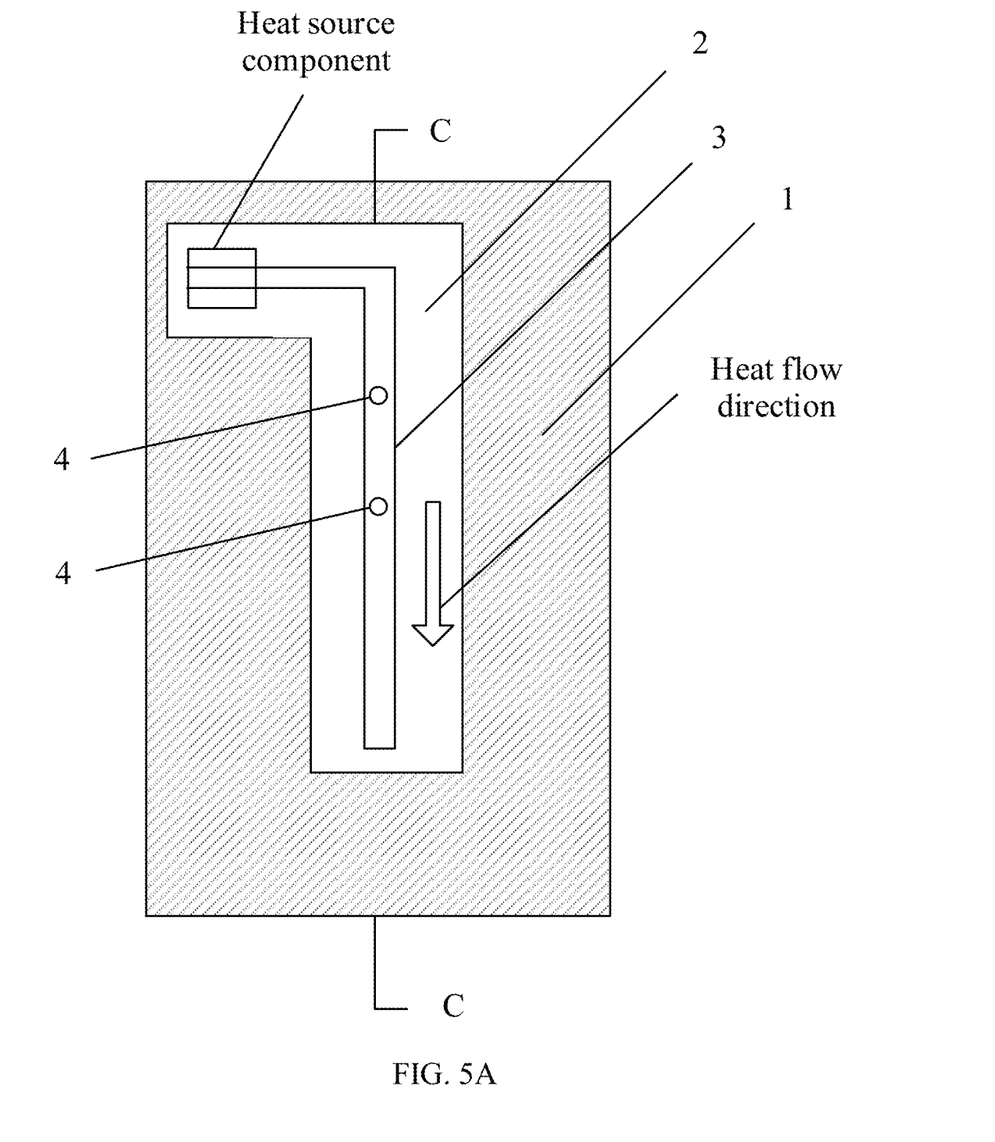
FIG. 5A is a main view of still another heat conduction component according to an embodiment of this application.
Figure 5B:
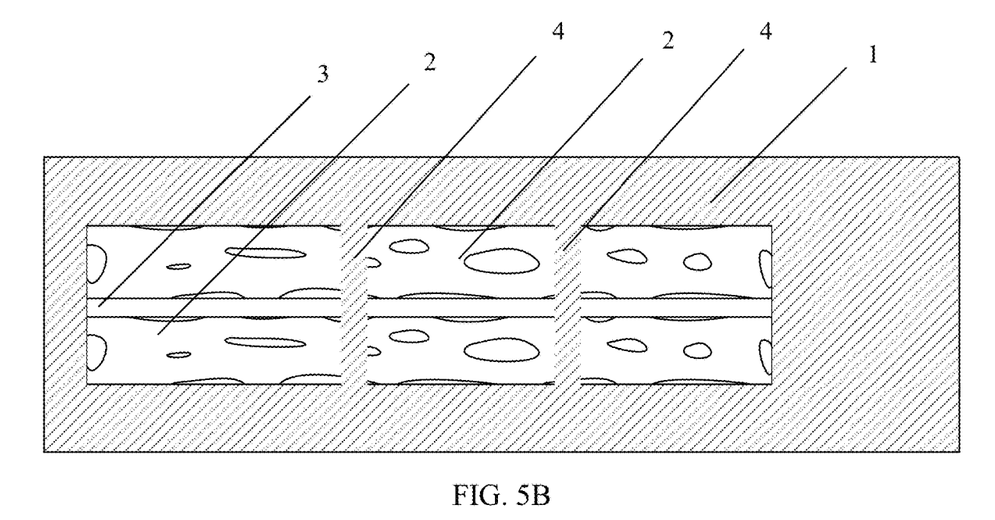
FIG. 5B is a sectional view along a direction C-C in FIG. 5A according to an embodiment of this application.

FIG. 5A is a main view of still another heat conduction component according to an embodiment of this application. FIG. 5B is a sectional view along a direction C-C in FIG. 5A according to an embodiment of this application. As shown in FIG. 5A and FIG. 5B, the heat conduction component is based on the heat conduction component shown in FIG. 4A and FIG. 4B, and the heat conduction component may further include a rib 4. The rib 4 is disposed in the heat dissipation part 2 and is connected to the support part 2. The rib is disposed in the heat dissipation part, so that structural strength of the heat conduction component can be effectively increased.

Optionally, there are one or more ribs 4, and a length direction of each rib is perpendicular to a length direction of the support part 1. A larger quantity of ribs indicates higher structural strength and a higher mechanical support capacity of the heat conduction component.

Optionally, the rib 4 and the support part 1 have a same 3D sintering process parameter.

For a heat conduction principle of the heat conduction component in this embodiment of this application, refer to the specific descriptions in the foregoing embodiments. Details are not described herein again.

In this embodiment, the heat dissipation part 2 having the mesh capillary holes is disposed, and the heat conduction medium is disposed in the heat dissipation part 2, so as to conduct heat for the heat source component of the mobile terminal. The one end of the heat dissipation part 2 fits the heat source component, and the other end fits the low temperature area, so that the heat generated by the heat source component can be conducted to the low temperature area, thereby implementing even temperature distribution of the mobile terminal. In this way, a temperature of the heat source component is reduced, so that even temperature distribution of the mobile terminal is implemented, thereby meeting a heat dissipation requirement of the mobile terminal, in addition, because the support part 1 and the heat dissipation part 2 of the heat conduction component are of an integrated structure, the heat conduction component may further provide mechanical support for the mobile terminal, so that a mechanical support requirement of the mobile terminal is met while a heat dissipation requirement of the heat source component is met, thereby implementing integration of a heat conduction and heat equalization function and a mechanical support function.

In addition, the heat dissipation channel 3 is disposed in the heat dissipation part 2, so that the heat of the heat source component is more easily conducted, thereby improving heat dissipation efficiency.

In addition, the rib 4 is disposed in the heat dissipation part 2, so that structural strength of the heat conduction component can be effectively increased.

An embodiment of this application further provides a mobile terminal. For details of a split structure of the mobile terminal, refer to the mobile terminal shown in FIG. 2. The heat conduction component described in the foregoing embodiment may be used as a middle metal plate of the mobile terminal, and the heat conduction component is used to conduct heat for a heat source component of the mobile terminal, so as to reduce a temperature of the heat source component. In addition, because a support part and a heat dissipation part of the heat conduction component are of an integrated structure, a mechanical support requirement of the heat conduction component serving as the middle metal plate of the mobile terminal is met while a heat dissipation requirement of the heat source component is met, so that integration of a heat conduction and heat equalization function and a mechanical support function is implemented.

In addition, a heat dissipation channel is disposed in the heat dissipation part, so that heat of the heart source component is more easily conducted, thereby improving heat dissipation efficiency.

In addition, a rib is disposed in the heat dissipation part, so that structural strength of the heat conduction component can be effectively increased.

It may be clearly understood by persons skilled in the art that for the purpose of convenient and brief description, division of the foregoing function modules is used as an example for illustration. In an actual application, the foregoing functions can be allocated to different function modules and implemented according to a requirement, that is, an inner structure of an apparatus is divided into different function modules to implement all or part of the functions described above. For a detailed working process of the foregoing apparatus, refer to a corresponding process in the foregoing method embodiments. Details are not described herein again.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:

1. A middle plate, comprising:
   a heat conduction component comprising:
      a support part defining a cavity;
      a heat dissipation part disposed in the cavity and having mesh capillary holes and a heat dissipating channel that comprises a through hole that extends from a first end of the heat dissipation part to a second end of the heat dissipation part, wherein the mesh capillary holes are located outside of the heat dissipating channel, wherein the first end of the heat dissipation part is configured to fit a heat source component, wherein a low temperature area is located at the second end of the heat dissipation part, and wherein a temperature of the low temperature area is lower than a temperature of an area in which the heat source component is configured to fit; and
      a heat conduction medium disposed in the mesh capillary holes and configured to conduct heat generated by the heat source component from the first end to the second end when the heat source component operates.

2. The middle plate of claim 1, wherein the support part consists of a single metal part that fully encloses the cavity, wherein the through hole is cylindrical, wherein the heat dissipation channel is configured to provide a channel for a gaseous heat conduction medium, wherein the mesh capillary holes are configured to provide channels for a liquid heat conduction medium, and wherein a function of the heat dissipation part is as follows when the heat source component operates: the liquid heat conduction medium in the mesh capillary holes is changed from a liquid state to a gaseous state at the first end of the heat dissipation part under the action of heat generated by the heat source component, the gaseous heat conduction medium flows to the second end of the heat dissipation part through the heat dissipation channel and is changed from the gaseous state to the liquid state at the second end of the heat dissipation part under the action of a low temperature of the low temperature area, and the liquid heat conduction medium is returned through the mesh capillary holes to the first end.

3. The middle plate of claim 2, further comprising a second heat dissipation channel in the cavity.

4. The middle plate of claim 3, wherein a plurality of heat dissipation channels are mutually disposed in parallel.

5. The middle plate of claim 2, wherein a shape of the cavity in which the heat dissipation part is disposed is determined with reference to positions of the heat source component and the low temperature area.

6. The middle plate of claim 2, wherein a size of the cavity in which the heat dissipation part is disposed is determined with reference to positions of the heat source component and the low temperature area.

7. The middle plate of claim 1, wherein the heat conduction component further comprises a rib disposed in the heat dissipation part and connected to the support part.

8. The middle plate of claim 7, wherein a length direction of the rib is perpendicular to a length direction of the support part.

9. The middle plate of claim 8, wherein the rib and the support part have a same three dimensional (3D) sintering process parameter.

10. The middle plate of claim 1, wherein the support part and the heat dissipation part have different three dimensional (3D) sintering process parameters.

11. A mobile terminal, comprising:
   a front housing;
   a rear housing; and
   a middle plate coupled to and between the front housing and the rear housing and comprising:
      a heat conduction component comprising:
         a support part comprising a cavity;
         a heat dissipation part disposed in the cavity and having mesh capillary holes and a heat dissipating channel that comprises a through hole that extends from a first end of the heat dissipation part to a second end of the heat dissipation part, wherein the mesh capillary holes are located outside of the heat dissipating channel, wherein the first end of the heat dissipation part is configured to fit a heat source component, wherein a low temperature area is located at the second end of the heat dissipation part, and wherein a temperature of the low temperature area is lower than a temperature of an area in which the heat source component is configured to fit; and a heat conduction medium disposed in the mesh capillary holes and configured to conduct heat generated by the heat source component from the first end to the second end when the heat source component operates.

12. The mobile terminal of claim 11, wherein the support part consists of a single metal part that fully encloses the cavity, wherein the through hole is cylindrical, wherein the heat dissipation channel is configured to provide a channel for a gaseous heat conduction medium, wherein the mesh capillary holes are configured to provide channels for a liquid heat conduction medium, and wherein a function of the heat dissipation part is as follows when the heat source component operates: the liquid heat conduction medium in the mesh capillary is holes is changed from a liquid state to a gaseous state at the first end of the heat dissipation part under the action of heat generated by the heat source component, the gaseous heat conduction medium flows to the second end of the heat dissipation part through the heat dissipation channel and is changed from the gaseous state to the liquid state at the second end of the heat dissipation part under the action of a low temperature of the low temperature area, and the liquid heat conduction medium is returned through the mesh capillary holes to the first end.

13. The mobile terminal of claim 12, further comprising a second heat dissipation channel within the cavity.

14. The mobile terminal of claim 12, wherein a plurality of heat dissipation channels are mutually disposed in parallel.

15. The mobile terminal of claim 11, wherein a size of the cavity in which the heat dissipation part is disposed is determined with reference to positions of the heat source component and the low temperature area.

16. The mobile terminal of claim 11, wherein a shape of the cavity in which the heat dissipation part is disposed is determined with reference to positions of the heat source component and the low temperature area.

17. The mobile terminal of claim 11, wherein the heat conduction component further comprises a rib disposed in the heat dissipation part and connected to the support part.

18. The mobile terminal of claim 17, wherein a length direction of the rib is perpendicular to a length direction of the support part.

19. The mobile terminal of claim 17, wherein the rib and the support part have a same three dimensional (3D) sintering process parameter.

20. The mobile terminal of claim 11, wherein the support part and the heat dissipation part have different three dimensional (3D) sintering process parameters.

* * * * *